United States Patent [19]

Shiino et al.

[11] Patent Number: 5,574,002
[45] Date of Patent: Nov. 12, 1996

[54] CLEANING AGENT COMPOSITION

[75] Inventors: Tohru Shiino, Hirakata; Kenichi Nobuta, Ikoma; Yoshikazu Yamagata, Katano, all of Japan

[73] Assignee: Matsushita Electric Industrial Co., Ltd., Osaka, Japan

[21] Appl. No.: 389,593

[22] Filed: Feb. 16, 1995

[30] Foreign Application Priority Data

Feb. 17, 1994 [JP] Japan .................................. 6-020143

[51] Int. Cl.$^6$ ................................. C11D 7/26; C11D 7/50
[52] U.S. Cl. .......................... 510/202; 510/175; 510/245; 510/365; 510/417; 510/203; 510/206
[58] Field of Search ..................................... 252/170, 173, 252/DIG. 10, DIG. 14

[56] References Cited

U.S. PATENT DOCUMENTS

| | | | |
|---|---|---|---|
| 3,772,049 | 11/1973 | Blanco et al. | 106/184 |
| 3,870,536 | 3/1975 | Blanco et al. | 106/146 |
| 3,882,038 | 5/1975 | Clayton et al. | 252/164 |
| 3,939,090 | 2/1976 | Zmoda | 252/90 |
| 4,309,300 | 1/1982 | Danforth et al. | 252/170 |
| 4,983,224 | 1/1991 | Mombrun et al. | 134/40 |
| 5,085,739 | 2/1992 | Berg et al. | 203/18 |
| 5,290,472 | 3/1994 | Michael | 252/170 |
| 5,382,298 | 1/1995 | Bondurant | 134/42 |
| 5,415,811 | 5/1995 | Wile et al. | 252/546 |
| 5,486,314 | 1/1996 | Wack et al. | 252/170 X |

FOREIGN PATENT DOCUMENTS

| | | |
|---|---|---|
| 62-252499 | 11/1987 | Japan . |
| 6-146041 | 5/1994 | Japan . |
| 6-49498 | 2/1995 | Japan . |

*Primary Examiner*—Douglas J. McGinty
*Attorney, Agent, or Firm*—Cushman, Darby & Cushman, L.L.P.

[57] ABSTRACT

A cleaning agent composition is disclosed which is excellent in removing ability of the soldering flux, wax and machine oil, easy in waste water disposal, and free from the global environmental concern, allowing safe operation. The composition comprises: A) at least one member selected from the group consisting of propylene glycol monoalkyl ether having a $C_{4-6}$ alkyl group and dipropylene glycol monoalkyl ether having a $C_{3-6}$ alkyl group, B) at least one member selected from the group consisting of methanol, ethanol, 1-propanol and 2-propanol, and C) water.

3 Claims, 1 Drawing Sheet

CLEANING AGENT COMPOSITION

BACKGROUND OF THE INVENTION

1. Field of the Invention

The present invention relates to a cleaning agent composition and a cleaning method employing the same. The cleaning agent composition and the cleaning method are effective for removing soldering flux applied during manufacturing processes of electric and electronic components and appliances, waxes applied for fastening works on jigs used in cutting or grinding process of the works, or any oils applied in press-working process. In more detail, the present invention is concerned with a cleaning agent composition for cleaning in particular, metal surfaces such as printed circuit boards, electronic components used in electric or electronic appliances and machine-worked components, and a cleaning method employing the cleaning agent composition.

2. Description of the Related Art

Heretofore, chlorofluorocarbons (hereinafter referred to as "CFCs") and chlorine-containing organic solvents represented by 1, 1, 1-trichloroethane, trichloroethylene, tetrachloroethylene, and dichloromethane have been employed as the cleaning agents for removing the residual soldering flux and the machine oil at the removal step.

It is however of urgent necessity to refrain from the use of these chlorine-containing organic solvents from the standpoint of the recently increasing global environmental concern. For instance, the CFCs and 1,1,1-trichloroethane have recently been considered responsible for destructing the ozone layer of the stratosphere surrounding the globe. The other chlorine-containing organic solvents, for instance, trichloroethylene, tetrachloroethylene and dichloromethane are typical carcinogenic substances, and have been contributing to contaminating underground water because they are liable to infiltrate into the ground soil.

As the cleaning agent composition that can be replaced with these chlorine-containing organic solvents, a cleaning agent composition consisting mainly of a glycol ether compound has specifically been proposed (Japanese Laid-Open Patent Publication No. Hei 3-162,496, Japanese Examined Patent Publication No. Hei 5-40,000, and so on). In a cleaning process using one of these cleaning agent compositions, it is generally required to perform an additional second step of removing the cleaning agent with tap water or deionized water from the object to be cleaned.

The glycol ether compounds disclosed in the above-mentioned Japanese Laid-Open Patent Publication No. Hei 3-162,496 are ethylene glycol compounds which are employed after mixed with water or with a surfactant in order to increase their cleaning ability and intermiscibility with water employed in the second step. Further, the cleaning agent composition disclosed in the Japanese Examined Patent Publication No. Hei 5-40,000 contains glycol ether compounds and it requires to be added with a nonionic surfactant and a phosphate ester on the same ground as that disclosed in the Japanese Laid-Open Patent Publication No. Hei 3-162,496. The ethylene glycol compounds however have a disadvantage that they cause a hazardous effects on human body. Moreover, when mixed with the surfactant, they are particularly difficult in disposal of waste water of their admixture with tap water or deionized water used in the second step.

In addition, the surfactants have been found by the present inventors to exert a serious influence on an insulation reliability of the electric or electronic appliances if they are allowed to remain in such appliances.

SUMMARY OF THE INVENTION

It is therefore a primary object of the present invention to provide a cleaning agent composition which has a high cleaning ability for soldering flux, wax and machine oil, and does not exert any serious influence on the insulation reliability of the appliances even if it remains in the electric or electronic appliances which are the objects to be cleaned. Disposal of the waste water of the cleaning agent composition can be performed relatively easily.

It is another object of the present invention to provide a cleaning method using the above-mentioned cleaning agent composition.

The present invention provides a cleaning agent composition comprising the following components A, B and C:

- A) at least one member selected from the group consisting of propylene glycol monoalkyl ether having an alkyl group containing from 4 to 6 carbon atoms and dipropylene glycol monoalkyl ether having an alkyl group containing from 3 to 6 carbon atoms,
- B) at least one member selected from the group consisting of methanol, ethanol, 1-propanol and 2-propanol, and
- C) water.

It is preferable that the proportion of the above-mentioned components A, B and C in the composition is from 40 to 200 parts by weight of the component B and from 1 to 200 parts by weight of the component C for 100 parts by weight of the component A.

Further, the above-mentioned component A is preferably at least one member selected from the group consisting of propylene glycol mononormalbutyl ether and dipropylen glycol mononormalpropyl ether, and the component B is preferably at least one member selected from the group consisting of methanol and ethanol.

The present invention also provides a cleaning method comprising the first step of washing an object to be cleaned in a container filled with the above-mentioned cleaning agent composition, the second step of washing in a container filled with water the object to be cleaned, attached with the cleaning agent composition which dissolves contaminants, and the third step of removing floating substance separated from the cleaning agent composition toward an upper phase over a water phase outside the container.

While novel features of the invention are set forth in the preceding, the invention, both as to organization and content, can be further understood and appreciated, along with other objects and features thereof, from the following detailed description and example when taken in conjunction with the attached drawings.

DESCRIPTION OF THE PREFERRED EMBODIMENTS

Figure 1:
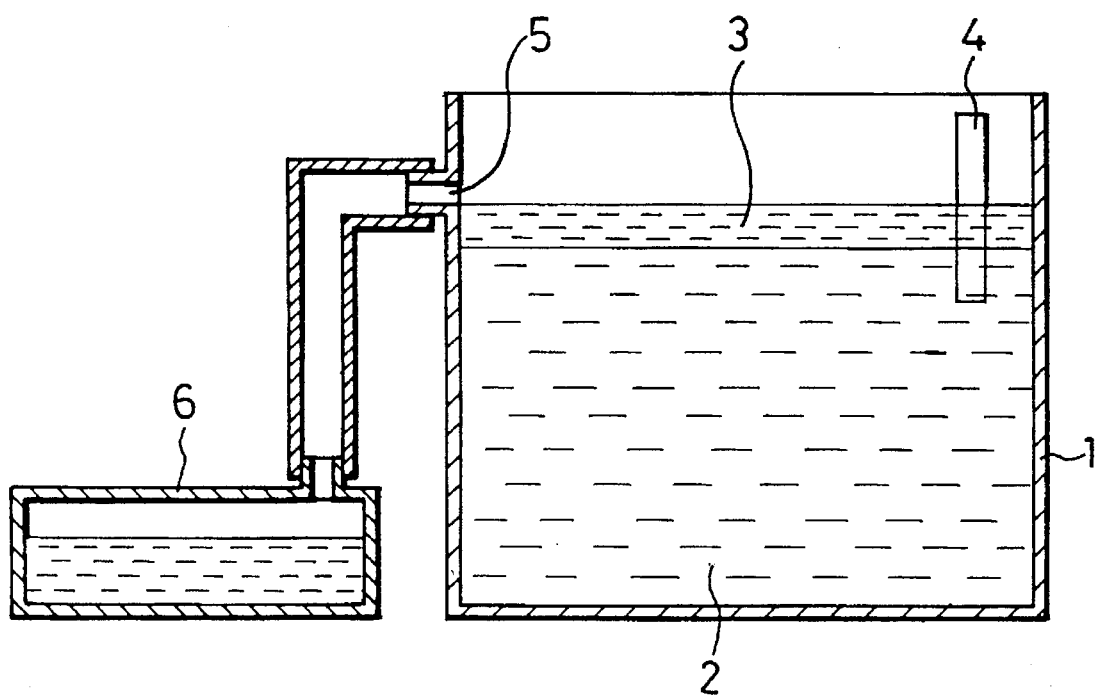
FIG. 1 is a schematic cross-sectional side view showing a cleaning container used in an embodiment of the present invention.

As described in the above, the preferable cleaning agent composition comprises:

- A) 100 parts by weight of at least one member selected from the group consisting of propylene glycol monoalkyl ether having an alkyl group containing from 4 to 6 carbon atoms and dipropylene glycol monoalkyl ether having an alkyl group containing from 3 to 6 carbon atoms, B) from 40 to 200 parts by weight of at least one member selected from the group consisting of methanol, ethanol, 1-propanol and 2-propanol, and C) from 1 to 200 parts by weight of water.

The component A constituting the cleaning agent composition of the present invention dissolves the soldering flux, wax and machine oil, but does not essentially intermix with water. By an addition of an alcohol of the component B in an adequate amount, the component A intermixes with water of the component C, thus giving a cleaning agent composition which has an excellent cleaning ability, a small influence on the human body and an acceptable incombustibility. Further, by adding a large quantity of water to the cleaning agent composition, it is possible to separate from water the glycol ether of the component A whose disposal is difficult in general, and to perform its removal from the cleaning solution easily, thus resulting in a relatively easy waste water disposal.

Of the glycol monoalkyl ethers, propylene glycol monoalkyl ethers of which alkyl group contains carbon atoms less than 4 and dipropylene glycol monoalkyl ethers of which alkyl group contains carbon atoms less than 3 are hydrophilic glycol ethers, and therefore, they cannot be separated from water. On the other hand, glycol monoalkyl ethers of which alkyl group contains seven or more carbon atoms have a high boiling point and are not available at a reasonable price because their commercial production scale is not sufficiently large. Both of these glycol ethers are not desirable as industrial cleaning agents.

As the industrial cleaning agents, those comprising a propylene glycol mononormalbutyl ether or dipropylene glycol mononormalpropyl ether as the component A are preferable, because they are inexpensive and have a relatively small viscosity.

A more incombustible cleaning agent can be obtained if the amount of highly inflammable alcohol is minimized as small as possible. Therefore, the amount of alcohol of the component B is preferably in a range from 40 to 100 parts by weight for 100 parts by weight of the component A. If the amount of alcohol of the component B is less than 40 parts by weight for 100 parts by weight of the component A, a phase separation will take place between the propylene glycol monoalkyl ether or dipropylene glycol monoalkyl ether of the component A and water of the component C. Therefore, such composition is not preferable because its cleaning ability as the cleaning agent composition is not uniform.

The cleaning agent composition of the present invention has a preferable cleaning ability on all of the soldering flux, wax and machine oil. Moreover, by adding water in excess, a phase separation can be induced in a part of the cleaning agent composition, particularly in the composition A, resulting in its floating over the water phase. Thus, waste water disposal becomes easier. The waste water disposal of the cleaning agent composition can also be performed easily by using an oil absorbing polymer.

FIG. 1 shows an apparatus for embodying the second and the third steps in the cleaning method of the present invention. That is, the container 1 which is used in the second and the third steps is filled with tap water or deionized water 2. The object to be cleaned which has been washed with the cleaning agent composition during the first step is adhered to its surface with the cleaning agent composition and contaminating substance dissolved therein. When this object to be cleaned is placed in the container 1, the component A in the cleaning agent composition and any contaminating substances dissolved in the component A, for instance the soldering flux, separate from water phase in the presence of the excessive water, and form a phase 3 over the water phase 2. By scraping the component A in the cleaning agent composition and any components dissolved in the component A forming the upper phase 3 with a plate-shaped member 4 made of a metal or a resin, they are introduced into an exhaust outlet 5 provided at an upper part of the container 1 and eventually discarded to a waste water tank 6. The alcohols, the component B in the cleaning agent composition, are mixed with water.

In the apparatus as shown, although the plate-shaped member 4 is used for introducing the upper phase separated from the water phase into the exhaust outlet 5, the same effect may alternatively be brought about by pouring water into the container in an excessive amount to induce overflowing of the content.

Moreover, the component A in the cleaning agent composition and the contaminant components dissolved in the component A may alternatively be absorbed in oil-absorbing resinous members which are caused to float over the upper phase separated from the water phase.

As an oil-absorbing polymer to be used as the oil-absorbing member, there are acrylic cross-linked polymer, urethane cross-linked polymer, ester cross-linked polymer and the like. Particularly, a cross-linked polymer having an oleophilic group such as acrylic cross-linked polymer (for instance, trade name "Oleosorb", available from Nippon Shokubai Co., Ltd., Japan) is preferred because of its high oil absorbing ability.

The following examples and comparative examples are given for the purpose of further illustrating the present invention with reference to the attached drawings, but are in no way to be taken as limiting.

EXAMPLE 1

A liquid was prepared by adding 100 g of water to 100 g of propylene glycol mononormalbutyl ether. In this state, this liquid is completely separated into two phases (a binary phase).

By dropwisely adding methanol, ethanol, 1-propanol, 2-propanol, 1-butanol, 2-butanol or 1-pentanol to each batch of this liquid, end points of the phase separation were confirmed for every batch. That is, the amount of addition which does not cause phase separation was searched for each alcohol. As a result, it was found that the amounts of addition were 47 g for methanol, 50 g for ethanol, 80 g for 1-propanol, and 69 g for 2-propanol, respectively.

On the contrary, the states of the initial two phases (binary phase) were maintained with the addition of 200 g of 1-butanol, 2-butanol and 1-pentanol.

Based on the results of the above-mentioned experiments, preferable mixing proportions of the components A, B and C were determined as stated in the above.

EXAMPLE 2

A printed circuit board (board surface area: 5 cm$^2$) mounted with a capacitor and a resistor was subjected to a soldering flux treatment with a rosin soldering flux (AGF-200-J3, available from Asahi Chemical K. K., Japan) and a soldering to obtain a test piece.

As the cleaning agent compositions for cleaning the test pieces, those listed in Table 1 below were prepared by employing propylene glycol mononormalbutyl ether (hereinafter referred to as "PGNB"), dipropylene glycol mononormalpropyl ether (hereinafter referred to as "DPGNP"), or dipropylene glycol mononormalhexyl ether (hereinafter referred to as "DPGNH") as the component A, ethanol (hereinafter referred to as "EtOH") or 2-propanol (hereinafter referred to as "IPA") as the component B, and water as the component C in various proportions.

TABLE 1

| Cleaning Agent | PGNB | DPGNP | DPGNH | EtOH | IPA | water |
|---|---|---|---|---|---|---|
| | | | | | | (in weight parts) |
| A | 100 | | | 50 | | 50 |
| B | 100 | | | 50 | | 100 |
| C | 100 | | | 50 | | 200 |
| D | 100 | | | 200 | | 50 |
| E | | 100 | | 50 | | 50 |
| F | | | 100 | | 50 | 50 |
| G | 100 | | | | 50 | 200 |
| H | 100 | | | 100 | | 250 |

(The cleaning agent H has a component proportion outside the scope of the invention, and is employed as a comparative example.)

A summary of the cleaning process of the test pieces performed with the above-mentioned cleaning agent compositions is shown in Table 2 below.

TABLE 2

| Steps in the cleaning process | Temperature | Time | Note |
|---|---|---|---|
| a) Washing with the cleaning agent composition | 60° C. | 60 sec. | Soaking with ultrasonic vibration |
| b) Washing with tap water | Room temperature | 60 sec. | Soaking with shaking by hand |
| c) Washing with deionized water | Room temperature | 60 sec. | Soaking with shaking by hand |
| d) Drying | 80° C. | 600 sec. | Warm air flow |

In the following paragraphs, the respective steps in the cleaning process will be described in detail:

Step a:

First, each 300 ml of the respective cleaning agent compositions was placed in a beaker of 300 ml volume, and each of the test pieces was soaked or dipped in the cleaning agent composition maintained at 60° C. After exposed to an ultrasonic vibration for 60 seconds, the test piece was picked up from the beaker. In this step, an ultrasonic vibration generator having an output of 120 W at a frequency of 47 kHz was used for cleaning the test pieces.

Step b:

Next, the test piece was soaked with tap water placed in a beaker of 300 ml volume and maintained at room temperature. After shaking the test piece in the water by hand for 60 seconds, the test piece was picked up from the beaker.

Step c:

Then, the test piece was soaked in deionized water in place of the tap water and washed in a similar manner to that in the step b.

Step d:

The test piece washed with deionized water was dried by applying the warm air flow at 80° C. for 10 minutes.

After subjected to the cleaning process performed by using the cleaning agent compositions in the above-mentioned manner, each of the cleaning agent compositions was measured for the amounts of ionic residues remaining in the test pieces. An Omega Meter Model 600 SC (trade name of the apparatus, available from Alpha Metals K. K., Japan) was employed for measuring the amounts of ions. The degree of remaining soldering flux was also evaluated by visual observation.

For comparison, a conventional cleaning method was also performed by using a cleaning agent composition consisting mainly of CFC 113 in CFCs (trade name "Daiflon Solvent S3", available from Daikin Industries, Ltd., Japan), wherein the above-mentioned test piece was placed in 300 ml of the cleaning agent composition contained in a beaker of 300 ml volume and the step of boiling the content was repeated twice, followed by a drying step. The results of these cleaning processes are summarized in Table 3 below.

TABLE 3

| Cleaning Agent | Ionic Residue | Residual Flux |
|---|---|---|
| A | ○ | ○ |
| B | Δ | Δ |
| C | Δ | Δ |
| D | ○ | ○ |
| E | ○ | ○ |
| F | ○ | ○ |
| G | Δ | Δ |
| H | X | X |
| CFC113 | Δ | Δ |

In the above-mentioned Table 3, the following marks of evaluation criteria are adopted:
Ionic Residue:
○: less than 14μg.NaCl/inch$^2$
Δ: 14 μg.NaCl/inch$^2$ or more but less than 30 μg - NaCl/inch$^2$
X: 30 μg - NaCl/inch$^2$ or more
Residual flux:
○: No flux was observed.
Δ: A small quantity of flux was observed.
X: A large quantity of flux was observed.

As clearly shown by Table 3 above, the cleaning agent compositions A through G of this example proves an ion removing ability which is equivalent to or more than that of the conventional cleaning agent composition comprising a CFC. On the contrary, the cleaning agent composition H employed for comparison was found to have a soldering flux removing ability which is inferior to that of the conventional cleaning agent composition, because it contained water in an excessive amount.

EXAMPLE 3

In the step b of washing with tap water in Example 2, a part of the cleaning agent composition of the present invention and the soldering flux dissolved in the cleaning agent composition were separated from the water phase and the solution turned to two phases. By scooping up the upper phase containing the soldering flux with a flat plate made of stainless steel, the upper phase was removed from the container. Therefore, it was possible to continuously perform the cleaning process without replacing or supplying the solution with new tap water at every end of the washing steps.

EXAMPLE 4

In this example, a wax removing ability of the cleaning agent composition of the present invention was evaluated.

Ten (10) units of ferrite magnetic head (size: 10 mm×5 mm with a thickness of 2 mm) were fixed on a jig with a wax (trade name Sky Wax E-69, available from Nikka Seiko Co., Ltd., Japan), and the combined body was used as a test sample in this example.

The above-mentioned test sample was soaked in each of the cleaning agent compositions listed in Table 1 of Example 2 and maintained at a temperature as listed in Table 4 below, and a time period until all of the 10 units of the magnetic heads were stripped from the jig was measured. During the soaking step, the test sample was irradiated with an ultrasonic beam using a generator similar to that of Example 2. For comparison, 1,1,1-trichloroethane was also employed as a conventional cleaning agent in boiling mode. The results of the measurement are summarized in Table 4 below.

TABLE 4

| Cleaning Agent | Liquid Temperature | Result |
| --- | --- | --- |
| A | 60° C. | ○ |
|  | 75° C. | ⊚ |
| B | 60° C. | Δ |
|  | 75° C. | ○ |
| C | 60° C. | Δ |
|  | 75° C. | ○ |
| D | 60° C. | Δ |
|  | 75° C. | ○ |
| E | 60° C. | ○ |
|  | 75° C. | ⊚ |
| F | 60° C. | Δ |
|  | 75° C. | ○ |
| G | 60° C. | Δ |
|  | 75° C. | Δ |
| H | 60° C. | X |
|  | 75° C. | Δ |
| 1,1,1-Trichloroethane | boiling | ○ |

In the above-mentioned Table 4, the following marks of evaluation criteria are adopted:
Wax Removing Time:
⊚: shorter than 3 minutes
○: 3 minutes or longer but shorter than 5 minutes
Δ: 5 minutes or longer but shorter than 10 minutes
X: 10 minutes or longer As clearly shown by Table 4 above, it was found that the cleaning agent compositions A through G of the present invention were able to dissolve and remove the wax. In actual practice, by irradiating the ultrasonic beam to the test sample, the cleaning agent compositions of the present invention demonstrated a wax removing ability which compares to that of the conventional cleaning agent of 1,1,1-trichloroethane.

Further, it was also found that it is preferable for the cleaning agent composition of the present invention to contain propylene glycol mononormalbutyl ether as much as possible from the viewpoint of the cleaning ability.

EXAMPLE 5

In this example, a machine oil removing ability of the cleaning agent composition of the present invention was evaluated.

A thousand (1,000) pieces of aluminum case for an electrolytic capacitor (diameter: 4 mm, height: 6.7 mm), accompanied by machine oil adhered on their surface after they were press-worked, were taken up as test pieces in this example, and washed with the cleaning agent compositions listed in Table 1 of Example 2 in the process steps briefly shown by Table 5 below. In the washing operation of this example, each 1000 ml of the cleaning agent compositions was used by placing it in a beaker of 1000 ml volume at every step of the process.

TABLE 5

| Steps in the cleaning process | Temperature | Time | Note |
| --- | --- | --- | --- |
| a) Washing with the cleaning agent composition | 60° C. | 150 sec. | Soaking with ultrasonic vibration |
| b) Washing with tap water | 60° C. | 150 sec. | Soaking with shaking by hand |
| c) Washing with deionized water | 60° C. | 150 sec. | Soaking with shaking by hand |
| d) Drying | 120° C. | 900 sec. | Warm air flow |

The cleaning ability of each of the cleaning agent compositions was evaluated in terms of the amount of residual oil remaining on the test pieces after the cleaning process. The amount of residual oil was determined by measuring the light absorption of the obtained sample. In the evaluation, measurement was performed using an infrared spectral analyzer (catalog number FTIR -8100M, available from Shimazu Corporation, Japan), based on a previously delineated calibration line of light absorption-residual oil.

For comparison, a generally applied conventional cleaning process was also performed for the identical test pieces by using a cleaning agent composition consisting mainly of CFC 113 (trade name "Daiflon Solvent S3", available from Daikin Industries, Ltd., Japan), and its oil removing ability was evaluated in a similar manner. The results of these cleaning processes are summarized in Table 6 below.

TABLE 6

| Cleaning Agent | Result |
| --- | --- |
| A | ⊚ |
| B | ⊚ |
| C | ○ |
| D | ⊚ |
| E | ⊚ |
| F | ○ |
| G | Δ |
| H | X |
| CFC 113 | ○ |

In the above-mentioned Table 6, the following marks of evaluation criteria are adopted:
Residual oil:
⊚: less than 0.1 mg/100 pieces
○: 0.1 mg/100 pieces or more but less than 0.5 mg/100 pieces
Δ: 0.5 mg/100 pieces or more but less than 2 mg/100 pieces
X: 2 mg/100 pieces or more As clearly shown by Table 6 in the above, it is appreciated that the cleaning agent compositions of the present invention have a favorable cleaning ability for the machine oil equivalent to that of the cleaning agent composition comprising a CFC.

EXAMPLE 6

In the step b of washing with tap water in Example 5, a part of the cleaning agent composition of the present invention and the machine oil dissolved in the cleaning agent composition were separated from the water phase to form an upper phase. By scooping up the upper phase with a flat plate made of stainless steel, the upper phase was removed from the container. Therefore, it was possible to continuously perform the cleaning process without replacing or supplying the solution with new tap water at every end of the washing steps.

EXAMPLE 7

As already shown in Examples 3 and 6, a part of the cleaning agent composition was separated from the water phase together with the soldering flux or machine oil as the upper phase floating over the water phase. By adding an oil absorbing polymer to the upper phase to absorb the components constituting the upper phase, they were able to be disposed.

In this example, an acrylic cross-linked polymer (trade name: Oleosorb, available from Nippon Shokubai Co., Ltd., Japan) was employed as the oil-absorbing polymer and was floated over the liquid surface constituting the upper phase in Example 6. After two minutes, about 80% of the liquid constituting the upper phase was absorbed by the Oleosorb.

Thus, the burden of waste water disposal can be greatly decreased, because the operation to be left is a disposal of the waste water only constituting the remaining phase.

Further, the oil absorbing polymer which has absorbed a part of the cleaning agent composition of the present invention can easily be disposed by combustion.

As stated in the forgoing, the cleaning agent composition of the present invention is excellent in removing ability of the soldering flux, wax and machine oil, easy in the waste water disposal, and free from the global environmental concern, allowing safe operation.

It is understood that various other modifications will be apparent to and can be readily made by those skilled in the art to which this invention pertains without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof, by those skilled in the art to which this invention pertains.

What is claimed is:

1. A cleaning agent composition consisting essentially of 100 parts by weight component A, 40–200 parts by weight component B, and 1–200 parts by weight component C; wherein component A contains at least one member selected from the group consisting of propylene glycol monoalkyl ether having an alkyl group containing from 4 to 6 carbon atoms and dipropylene glycol monoalkyl ether having an alkyl group containing from 3 to 6 carbon atoms;

component B contains at least one member selected from the group consisting of methanol, ethanol, 1-propanol and 2-propanol; and component C is water.

2. A cleaning agent composition consisting essentially of 100 parts by weight component A, 40–200 parts by weight component B, and 1–200 parts by weight component C; wherein component A contains at least one member selected from the group consisting of propylene glycol monoalkyl ether having an alkyl group containing from 4 to 6 carbon atoms and dipropylene glycol monoalkyl ether having an alkyl group containing from 3 to 6 carbon atoms;

component B contains at least one member selected from the group consisting of methanol and ethanol; and component C is water.

3. The cleaning agent composition in accordance with claim 2 wherein said component A is at least one member selected from the group consisting of propylene glycol mononormalbutyl ether and dipropylene glycol mononormal propyl ether.

* * * * *